United States Patent
Bao et al.

(10) Patent No.: US 11,398,505 B2
(45) Date of Patent: Jul. 26, 2022

(54) DISPLAY SUBSTRATE AND MANUFACTURING METHOD THEREOF, DISPLAY PANEL, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Zheng Bao, Beijing (CN); Hongwei Hu, Beijing (CN); Yanxia Xin, Beijing (CN); Xueping Li, Beijing (CN); Yihao Wu, Beijing (CN); Gong Chen, Beijing (CN); Peng Xu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 16/769,364

(22) PCT Filed: Jun. 27, 2019

(86) PCT No.: PCT/CN2019/093358
§ 371 (c)(1),
(2) Date: Jun. 3, 2020

(87) PCT Pub. No.: WO2020/258185
PCT Pub. Date: Dec. 30, 2020

(65) Prior Publication Data
US 2021/0408076 A1 Dec. 30, 2021

(51) Int. Cl.
*H01L 27/12* (2006.01)
*G02F 1/1345* (2006.01)
*H01L 27/32* (2006.01)

(52) U.S. Cl.
CPC ........ *H01L 27/1244* (2013.01); *G02F 1/1345* (2013.01); *H01L 27/1259* (2013.01); *H01L 27/3279* (2013.01)

(58) Field of Classification Search
None
See application file for complete search history.

(56) References Cited

U.S. PATENT DOCUMENTS 10,394,098 B2    8/2019  Wang
2004/0002190 A1*  1/2004  Chang ............... H01L 27/11521
                                                           438/257

(Continued)

FOREIGN PATENT DOCUMENTS

CN    106206614 A    12/2016
CN    106887424 A     6/2017

(Continued)

OTHER PUBLICATIONS

International Search Report of PCT/CN2019/093358 in Chinese, dated Mar. 12, 2020.

(Continued)

*Primary Examiner* — Bo B Jang
(74) *Attorney, Agent, or Firm* — Collard & Roe, P.C.

(57) ABSTRACT

Embodiments of the present disclosure provide a display substrate, a display panel, a display device, and a manufacturing method of the display substrate. The display substrate includes a display region and a peripheral region located at an outer side of the display region, and the peripheral region includes a bonding region. The display substrate includes: a base substrate, and a first metal pattern and a second metal pattern which are provided on the base substrate and located in the bonding region, the second metal pattern covers at least a portion of at least one side surface of the first metal (Continued)

pattern, and an activity of a metal of the second metal pattern is weaker than an activity of a metal of the first metal pattern.

18 Claims, 4 Drawing Sheets

(56) References Cited

U.S. PATENT DOCUMENTS

| | | | |
|---|---|---|---|
| 2006/0154389 A1* | 7/2006 | Doan | H01L 33/44 |
| | | | 438/21 |
| 2016/0259446 A1* | 9/2016 | Kim | G06F 3/0445 |
| 2018/0039360 A1* | 2/2018 | Akimoto | G06F 3/0446 |
| 2018/0267376 A1* | 9/2018 | Wang | H01L 27/15 |
| 2019/0087034 A1 | 3/2019 | Dai et al. | |
| 2020/0013330 A1* | 1/2020 | Kim | H01L 27/1218 |
| 2020/0194468 A1 | 6/2020 | Luo | |

FOREIGN PATENT DOCUMENTS

| | | |
|---|---|---|
| CN | 107632731 A | 1/2018 |
| CN | 109459895 A | 3/2019 |

OTHER PUBLICATIONS

Notice of Transmittal of the International Search Report of PCT/CN2019/093358 in Chinese, dated Mar. 12, 2020.

Written Opinion of the International Searching Authority of PCT/CN2019/093358 in Chinese, dated Mar. 12, 2020.

* cited by examiner

DISPLAY SUBSTRATE AND MANUFACTURING METHOD THEREOF, DISPLAY PANEL, AND DISPLAY DEVICE

CROSS REFERENCE TO RELATED APPLICATIONS

This application is the National Stage of PCT/CN2019/093358 filed on Jun. 27, 2019, the disclosure of which is incorporated by reference.

TECHNICAL FIELD

Embodiments of the present disclosure relate to a display substrate, a display panel, a display device, and a manufacturing method of the display substrate.

BACKGROUND

In microcircuits such as a semiconductor device, a thin film transistor liquid crystal display (TFT-LCD), and an organic light-emitting diode (OLED) display, a metal pattern is formed by forming a low-resistance metal film in a peripheral region of a base substrate and then performing an etching process on the low-resistance metal film to form.

Materials for manufacturing the microcircuits as described above, for example, materials for manufacturing gate lines and data lines of the thin film transistor-liquid crystal display (TFT-LCD), and materials for manufacturing an integrated circuit located in a bonding region of the organic light-emitting diode (OLED) display, are generally selected from metals such as Ta, Cr, Mo, etc., which have relatively stable chemical properties but relatively high resistivity, or metal alloys formed by the above metals. In the case that the size of the TFT-LCD and the size of the OLED display are small and the resolution of the TFT-LCD and the resolution of the OLED display are low, the delay of electrical signals is relatively small and the adverse effect of the delay of electrical signals on the display effect of the display device is not obvious. However, as the size and the resolution of the TFT-LCD and the size and the resolution of the OLED display increase, the length of the metal wire also increases, the delay of electrical signals also increases; if the delay of electrical signals increases to a certain extent, the problem of uneven brightness will be caused, thus seriously affecting display quality of an image.

SUMMARY

At least one embodiment of the present disclosure provides a display substrate, and the display substrate includes: a display region and a peripheral region located at an outer side of the display region, and the peripheral region comprising a bonding region, in which the display substrate includes: a base substrate, a first metal pattern and a second metal pattern which are provided on the base substrate and located in the bonding region, the second metal pattern covers at least a portion of at least one side surface of the first metal pattern, and an activity of a metal of the second metal pattern is weaker than an activity of a metal of the first metal pattern.

For example, in the display substrate provided by at least one embodiment of the present disclosure, a conductivity of the metal of the first metal pattern is greater than a conductivity of the metal of the second metal pattern.

For example, in the display substrate provided by at least one embodiment of the present disclosure, the second metal pattern further covers a surface of the first metal pattern facing away from the base substrate.

For example, the display substrate provided by at least one embodiment of the present disclosure further includes: a third metal pattern, in which the third metal pattern is provided at a side of the first metal pattern close to the base substrate.

For example, in the display substrate provided by at least one embodiment of the present disclosure, the second metal pattern covers at least a portion of at least one side surface of the third metal pattern.

For example, in the display substrate provided by at least one embodiment of the present disclosure, a metal of the third metal pattern is the same as the metal of the second metal pattern.

For example, in the display substrate provided by at least one embodiment of the present disclosure, the metal of the first metal pattern includes an aluminum-based metal.

For example, in the display substrate provided by at least one embodiment of the present disclosure, the aluminum-based metal includes one or more selected from a group consisting of Al, AlMo, AlTi, AlMoW, AlMoNb and AlMoTi.

For example, in the display substrate provided by at least one embodiment of the present disclosure, in the aluminum-based metal, a mass percentage of aluminum is ranged from 85 wt % to 100 wt %.

For example, in the display substrate provided by at least one embodiment of the present disclosure, the metal of the second metal pattern includes one or more selected from the group consisting of nickel, cobalt, molybdenum, tungsten, copper, niobium and titanium.

For example, the display substrate provided by at least one embodiment of the present disclosure, includes: a plurality of first metal patterns and a plurality of second metal patterns, in which the plurality of first metal patterns are spaced apart from each other, and the plurality of second metal patterns are spaced apart from each other.

At least one embodiment of the present disclosure further provides a display panel, which includes the display substrate according to any one of the above.

At least one embodiment of the present disclosure further provides a display device, which includes the display panel according to any one of the above.

At least one embodiment of the present disclosure further provides a manufacturing method of a display substrate, the display substrate includes: a display region, and a peripheral region located at an outer side of the display region, and the peripheral region including a bonding region; and the manufacturing method includes: providing a base substrate, forming a first metal pattern on the base substrate and in the bonding region, and forming a second metal pattern on at least a portion of at least one side surface of the first metal pattern, in which an activity of a metal of the second metal pattern is weaker than that an activity of a metal of the first metal pattern.

For example, in the manufacturing method provided by at least one embodiment of the present disclosure, a conductivity of the metal of the first metal pattern is greater than a conductivity of the metal of the second metal pattern.

For example, in the manufacturing method provided by at least one embodiment of the present disclosure, the second metal pattern further covers a surface of the first metal pattern facing away from the base substrate.

For example, in the manufacturing method provided by at least one embodiment of the present disclosure, forming the second metal pattern on at least a portion of at least one side surface of the first metal pattern, includes: forming a second metal film on the first metal pattern, and performing a patterning process on the second metal film to form the second metal pattern covering at least a portion of at least one side surface of the first metal pattern.

For example, in the manufacturing method provided by at least one embodiment of the present disclosure, the patterning process performed on the second metal film includes a dry etching process.

For example, the manufacturing method provided by at least one embodiment of the present disclosure, further includes: forming a third metal pattern, in which the third metal pattern is formed at a side of the first metal pattern close to the base substrate.

For example, the manufacturing method provided by at least one embodiment of the present disclosure, includes: forming the first metal pattern and the third metal pattern in a same patterning process.

For example, in the manufacturing method provided by at least one embodiment of the present disclosure, the forming the first metal pattern and the third metal pattern in the same patterning process, includes: sequentially forming a third metal film and a first metal film, and simultaneously performing a dry etching process on the third metal film and the first metal film to form the first metal pattern and the third metal pattern.

For example, the manufacturing method provided by at least one embodiment of the present disclosure, the second metal pattern covers at least a portion of at least one side surface of the third metal pattern.

For example, the manufacturing method provided by at least one embodiment of the present disclosure, the metal of the third metal pattern is the same as the metal of the second metal pattern.

BRIEF DESCRIPTION OF THE DRAWINGS

In order to clearly explain the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1:
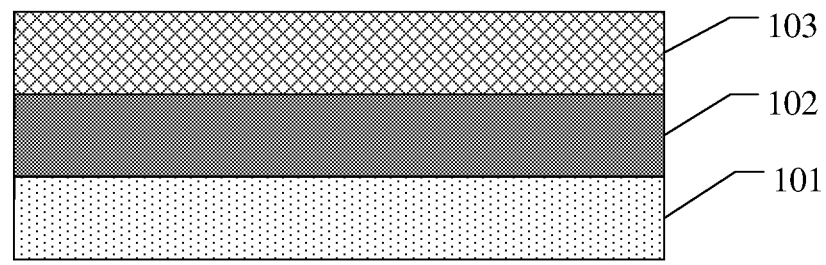
FIG. 1 is a schematic cross-sectional structural view of a conductive pattern in a bonding region.

101—First metal layer; 102—Low-resistance metal layer; 103—Second metal layer; 104—Organic insulation layer; 2—Display substrate; 21—Display region; 22—Peripheral region; 221—Bonding region; 23—Base substrate; 20—Conductive pattern; 201—First metal pattern; 2011—Upper surface of the first metal pattern; 2012—Side surfaces of the first metal pattern; 202—Second metal pattern; 203—Third metal pattern; 30—Display panel; 31—Array substrate; 32—Counter substrate; 33—Liquid crystal layer; 301—First substrate; 302—Gate electrode; 303—Gate insulation layer; 304—Active layer; 305—First source-drain electrode; 306—Second source-drain electrode; 307—Organic insulation layer; 308—Passivation layer; 309—First electrode; 310—Second electrode; 311—Common electrode line; 312—First insulation layer; 321—Second substrate; 322—Color filter layer; 341—Base substrate; 342—Drive transistor; 343—Cathode; 344—Anode; 345—Organic functional layer; 3421—Gate electrode; 3422—Source electrode; 3423—Drain electrode; 3424—Active layer; 346—Pixel defining layer; 347—Passivation layer; 348—Encapsulation layer; 40—Display device.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a portion but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left"

and the like are only used to indicate relative position relationship, and when the position of the described object is changed, the relative position relationship may be changed accordingly.

In the manufacturing process of the display device, for example, in the manufacturing process of the thin film transistor-liquid crystal display device and the organic light-emitting display device, a thin film transistor is required to be manufactured, and the thin film transistor may be a drive transistor or a switch transistor. At present, the thin film transistor (TFT), which has been industrialized, mainly uses amorphous silicon, polysilicon, monocrystalline silicon, metal oxide or carbon nanotube as the material of an active layer. The thin film transistors of the above-mentioned various types usually use a low-resistance metal as the material of conducting wires or metal electrodes, and integrated circuits in bonding regions are also usually manufactured by the low-resistance metal. However, the low-resistance metal is easily reacted with an etching solution used in the subsequent processes of manufacturing layers or electrodes, thus affecting the conductive properties of the metal wires and the metal electrodes manufactured by the low-resistance metal material, and further seriously affecting the performance of the display device.

For example, a first metal layer and a second metal layer are respectively formed on the upper side of the low-resistance metal layer and the lower side of the low-resistance metal layer. For example, taking aluminum as the low-resistance metal for example, a titanium metal layer is formed on the upper side of the aluminum metal layer and the lower side of the aluminum metal layer, and the titanium metal layer formed on the side of the aluminum metal layer facing away from the base substrate can reduce the resistance of the contact surface between the aluminum metal layer and other conductive layers. For example, the resistance of the contact surface between the aluminum metal layer and a polysilicon layer is relatively large, the titanium metal layer formed on the side of the aluminum metal layer close to the base substrate can form a bridge bond with the polysilicon of the polysilicon layer to reduce the resistance between the aluminum metal layer and the polysilicon layer.

For example, FIG. 1 is a schematic cross-sectional structural view of a conductive pattern in a bonding region. The conductive pattern is arranged in the bonding region of the base substrate. As shown in FIG. 1, a first metal layer 101 and a second metal layer 103 are respectively formed on an upper side of the low-resistance metal layer 102 and a lower side of the low-resistance metal layer 102. The forming process of the three-layer structure of the first metal layer, the low-resistance metal layer and the second metal layer includes the following steps of: sequentially depositing a thin film for the first metal layer, a thin film for the low-resistance metal layer, and a thin film for the second metal layer, and then performing a dry etching process and the like on the stack of the thin film for the first metal layer, the thin film for the low-resistance metal layer, and the thin film for the second metal layer to form the three-layer laminated structure of the first metal layer, the low-resistance metal layer and the second metal layer. For example, the side surface of the low-resistance metal layer in the middle of the three-layer laminated structure will be exposed to the outside after performing the above-mentioned dry etching, so that the etching solution used in the subsequent process of forming other layers or electrode structures will react with the side surface of the low-resistance metal layer, that is, an erosion of the side surface will occur. In addition, the problems of indentation and disconnection of the low-resistance metal layer 102 may further be caused. The side surface erosion phenomenon, and the problems of indentation and disconnection of the low-resistance metal layer can cause the conductivity of the metal wires or the metal electrodes formed by the three-layer laminated structure of the first metal layer, the low-resistance metal layer and the second metal layer to be seriously reduced.

For example, in the process of manufacturing the flexible organic light-emitting diode display device, the bonding region of the display device is directly connected with output lines of the integrated circuit by using an exposed conductive pattern. For example, the conductive pattern is a three-layer metal structure of Ti/Al/Ti. In the process of manufacturing a backplate of the flexible organic light-emitting diode display device, a wet etching process is adopted when forming an anode layer. Because the conductive pattern in the bonding region is exposed and the metal Al of the conductive pattern Ti/Al/Ti is an active metal, the metal Al is easy to react with the etching solution for manufacturing the anode layer, so that the exposed side surface of the metal Al is etched.

Figure 2:
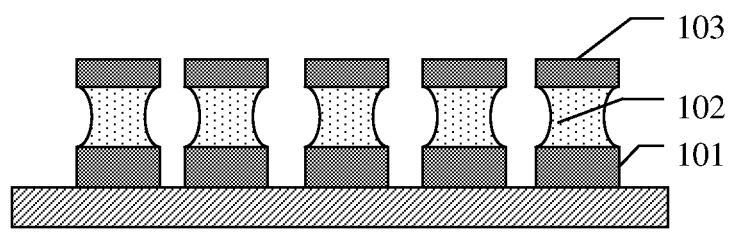
FIG. 2 is a schematic cross-sectional structural view in which a side surface of a low-resistance metal layer is etched.

For example, FIG. 2 is a schematic cross-sectional structural view in which the side surface of a low-resistance metal layer 102 is etched. The first metal layer 101 and the second metal layer 103 are not etched, and a left side surface of the low-resistance metal layer 102 and a right side surface of the low-resistance metal layer 102 are etched. In the subsequent processes of forming other layers or electrodes by etching, because the etching effect of the etching solution is non-directional, the conductive pattern shows indentation on the side surface as shown in the cross-sectional view of the conductive pattern, which is called as an undercut phenomenon (i.e. side surface erosion phenomenon). The undercut phenomenon easily leads to short circuit or signal delay. These problems slow down the process of thinning the metal wire, thus affecting the development of high-resolution products. In addition, in the case that an anode film is subsequently etched and the anode film includes silver, Ag particles may be generated, and Ag particles may be easily deposited in the display device, which leads to defects such as dark spots, etc.

Figure 3:
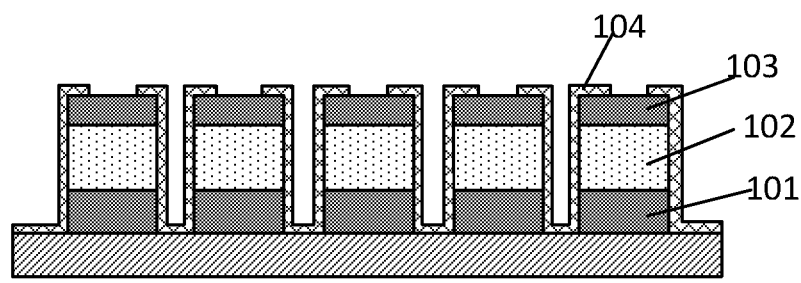
FIG. 3 is a schematic cross-sectional structural view of a conductive metal pattern in which a side surface of the conductive metal pattern and a portion of an upper surface of the conductive metal pattern are coated with an organic insulation layer.

In the related art, a half tone mask (HTM) process is used to form an organic insulation layer on at least a portion of at least one side surface of the conductive pattern and on a portion of the upper surface of the conductive pattern to prevent etching solution from etching the low-resistance metal layer in the conductive pattern, and at least a portion of the upper surface of the conductive pattern is exposed without being covered by the organic insulation layer in order to ensure the conductivity of the conductive pattern. For example, FIG. 3 is a schematic cross-sectional structural view of the conductive pattern in which the side surface of the conductive pattern and a portion of the upper surface of the conductive pattern are coated with the organic insulation layer. Different regions of the organic insulation layer (for example, PLN) 104 are made to have different thicknesses through a half tone mask. For example, the thickness of the PLN layer in the display region is 1.5 μm, and the thickness of the PLN layer covering on the conductive pattern in the bonding region is 1.1 μm. Thus, the thin organic insulation layer formed on the conductive pattern in the bonding region can protect the conductive pattern from being etched; however, the structure shown in FIG. 3 will add a step for manufacturing the organic insulation layer, thus complicating the whole process and increasing the production cost.

At least one embodiment of the present disclosure provides a display substrate, the display substrate includes: a display region and a peripheral region located at an outer side of the display region, and the peripheral region includes a bonding region. The display substrate includes: a base substrate; a first metal pattern and a second metal pattern, which are provided on the base substrate and located in the bonding region, the second metal pattern covers at least a portion of at least one side surface of the first metal pattern, and an activity of a metal of the second metal pattern is weaker than an activity of a metal of the first metal pattern. According to the embodiments of the present disclosure, the second metal pattern covering at least a portion of at least one side surface of the first metal pattern is formed on the first metal pattern to prevent at least a portion of the side surface of the first metal pattern from being etched by an etching solution used in the subsequent processes of forming other layers or electrodes, thereby reducing the problem that the conductivity of the first metal pattern decreases and further reducing the problem of product yield reduction. In addition, the conductive pattern provided by the embodiments of the present disclosure further reduces the complexity of manufacturing process of the conductive pattern and reduces the production cost.

It should be noted that an activity of a metal refers to the flexibility that the metal is replaced; the more the activity of the metal is, the less the flexibility that the metal is replaced. According to the order that the metals are arranged in a metal activity sequence table, the activities of the metals gradually decreases from front to back in the metal activity sequence table. In the metal activity sequence table, the position of the metal for forming the first metal pattern is ahead of the position of the metal for forming the second metal pattern.

It should also be noted that the activity of the metal of the second metal pattern is weaker than the activity of the metal of the first metal pattern, which means that the activity of the metal with the largest mass percentage in the second metal pattern is weaker than that the activity of the metal with the largest mass percentage in the first metal pattern. If the second metal pattern is consisted of a single metal and the first metal pattern is consisted of a single metal, the activity of the single metal of the second metal pattern is weaker than the activity of the single metal of the first metal pattern. If the second metal pattern is consisted of a single metal and the first metal pattern is consisted of an alloy of metals, the activity of the single metal of the second metal pattern is weaker than the activity of the metal with the largest mass percentage in the alloy of the first metal pattern. If the second metal pattern is consisted of an alloy of metals and the first metal pattern is consisted of a single metal, the activity of the metal with the largest mass percentage in the alloy of the second metal pattern is weaker than the activity of the single metal of the first metal pattern. If the second metal pattern is consisted of an alloy of metals and the first metal pattern is consisted of an alloy of metals, the activity of the metal with the largest mass percentage in the metal alloy of the second metal pattern is weaker than the activity of the metal with the largest mass percentage in the metal alloy of the first metal pattern.

It should also be noted that the second metal pattern covers at least a portion of at least one side surface of the first metal pattern, which means that the second metal pattern covers an entirety of each of the side surfaces of the first metal pattern, or an entirety of one of the side surfaces of the first metal pattern and a portion of another side surface of the first metal pattern, or a portion of each side surface of the first metal pattern, or only a portion of one of the side surfaces of the first metal pattern. In order to better protect the first metal pattern, the second metal pattern covers an entirety of each of the side surfaces of the first metal pattern.

It should also be noted that in the case where the second metal pattern covers at least a portion of at least one side surface of the first metal pattern, the second metal pattern for example further covers a surface of the first metal pattern close to the base substrate, which may increase the process difficulty.

Figure 4:
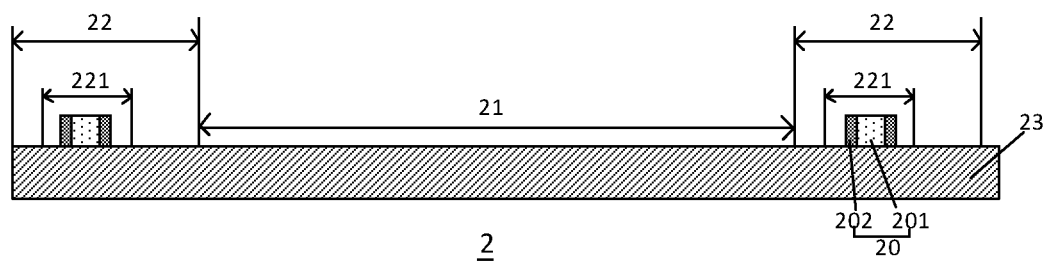
FIG. 4 is a schematic cross-sectional structural view of a display substrate according to embodiments of the present disclosure.

For example, FIG. 4 a schematic cross-sectional structural view of the display substrate according to the embodiments of the present disclosure. As shown in FIG. 4, the display substrate 2 includes the display region 21 and the peripheral region 22 at the outer side of the display region 21, and the peripheral region 22 includes the bonding region 221. The display substrate 2 includes the base substrate 23, the first metal pattern 201, and the second metal pattern 202. The first metal pattern 201 and the second metal pattern 202 are arranged on the base substrate 23 and within the bonding region 221. The second metal pattern 202 covers at least a portion of at least one side surface of the first metal pattern 201, and the activity of the metal of the second metal pattern 202 is weaker than the activity of the metal of the first metal pattern 201. For example, the first metal pattern 201 and the second metal pattern 202 constitute a conductive pattern 20 located in the bonding region 221 of the display substrate 2. For example, FIG. 4 illustrates an example in which the second metal pattern 202 covering the entirety of each of the side surfaces of the first metal pattern 201.

Other embodiments of the conductive pattern 20 in the bonding region 221 of the display substrate will be described in detail below.

Figure 5:
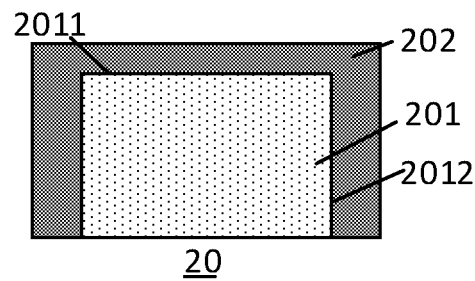
FIG. 5 is a schematic cross-sectional structural view of a conductive pattern in the display substrate according to the embodiments of the present disclosure.

For example, FIG. 5 a schematic cross-sectional structural view of the conductive pattern in the display substrate according to the embodiments of the present disclosure. As shown in FIG. 5, the conductive pattern 20 includes the first metal pattern 201 and the second metal pattern 202, and the second metal pattern 202 covers an upper surface 2011 (a surface facing away from the base substrate) of the first metal pattern 201 and the entirety of each of the side surfaces 2012 of the first metal pattern 201. The activity of the metal of the second metal pattern 202 is weaker than the activity of the metal of the first metal pattern 201. The second metal pattern 202 completely isolates the exposed upper surface 2011 of the first metal pattern 201 and the exposed side surfaces 2012 of the first metal pattern 201 from the outside, thereby preventing the first metal pattern 201 from being etched by the etching solution used in the subsequent processes of forming other layers, and avoiding the problem that the conductivity of the first metal pattern 201 decreases.

It should be noted that the second metal pattern covers the upper surface of the first metal pattern, which means that the second metal pattern covers an entirety of or a portion of the upper surface of the first metal pattern. FIG. 5 illustrates an example in which the second metal pattern 202 covers an entirety of the upper surface 2011 of the first metal pattern 201.

For example, other layers or electrodes that are subsequently formed include an anode, a cathode and the like in the flexible organic light-emitting diode display device, or a pixel electrode, a common electrode and the like in the thin film transistor-liquid crystal display device.

For example, the etching solution used in the subsequent processes of forming other layers or electrodes include ferric chloride, nitric acid, phosphoric acid, pH regulator, corrosion inhibitor, and defoaming agent. The etching solution uses phosphoric acid as the main acidic medium. Although there are certain concentrations of chloride ions and nitric acid in the etching solution, the phosphoric acid has a dominant percentage, and the reaction speed of the phosphoric acid with the materials of the layers or electrodes to be etched is relatively mild. The addition of phosphoric acid increases the viscosity of the etching solution, which is beneficial to reducing the influence of side surface erosion and making a surface of the layer or electrode to be flat.

For example, the pH regulator is one or more selected from the group consisting of boric acid, formic acid, acetic acid, propionic acid, butyric acid, alginic acid, isobutyric acid, valeric acid, isovaleric acid, oxalic acid, citric acid, maleic acid and adipic acid. The corrosion inhibitor is one or more selected from the group consisting of molybdate, tungstate, nitrate, sodium dodecyl sulfate, triethanolamine, ethylenediamine, trimethylene diamine and pyridine. The defoaming agent is one or more selected from the group consisting of OP-10, dimethylsiloxane, n-octanol and siloxane glycol.

As shown in FIG. 5, the second metal pattern 202 covers an entirety of the upper surface 2011 of the first metal pattern 201 and an entirety of each of the side surfaces 2012 of the first metal pattern 201, and the second metal pattern 202 is exposed. In this case, the second metal pattern 202 may react with an etching solution so that the second metal pattern 202 is etched under a normal temperature condition; however, even if the second metal pattern 202 reacts with the etching solution, the reaction of the first metal pattern 201 with the etching solution can be reduced or avoided, thereby protecting the first metal pattern 201. Alternatively, a protective film is formed at an initial stage of the reaction between the second metal pattern 202 and the etching solution, which prevents the reaction between the second metal pattern 202 and the etching solution from continually performing to protect the first metal pattern and prevent the etching solution from further reacting with the first metal pattern to cause generation of the side surface erosion phenomenon of the first metal pattern.

For example, the metal of the second metal pattern 202 includes one or more selected from the group consisting of nickel, cobalt, molybdenum, copper, tungsten, niobium, and titanium. That is, the second metal pattern 202 for example is consisted of a single metal of nickel, cobalt, molybdenum, tungsten, copper, niobium, and titanium, or is consisted of an alloy formed of two or more selected from the group consisting of the above metals, such as, NiCo, NiMo, NiTi, NiCu, CuNb, NiW, etc. In the metal activity sequence table, the above metals are located behind aluminum and the above metals are easily reacted with an acidic etching solution to form the protective film to prevent the reaction from continually performing, so that the reacting of the metal of the first metal pattern with the etching solution can be reduced or prevented to protect the first metal pattern.

For example, the activity of the metal of the second metal pattern 202 is weaker than the activity of hydrogen, for example, the metal of the second metal pattern 202 includes copper, silver, platinum, etc. In this way, the second metal pattern 202 does not react with the etching solution, so that the second metal pattern 202 will not be etched, which also prevents the etching solution from contacting the first metal pattern 201, thus preventing the first metal pattern 201 from reacting with the etching solution to protect the first metal pattern 201 and avoid the side surface erosion problem of the first metal pattern 201. Further, the amount of metal used to manufacturing the second metal pattern is large and the price of silver and platinum is very expensive, which is not suitable for large-scale industrial production. Therefore, copper is selected as the metal of the second metal pattern.

For example, the conductivity of the metal of the first metal pattern 201 is greater than the conductivity of the metal of the second metal pattern 202. In this way, the first metal pattern 201 that is not laterally etched can ensure that the entire conductive pattern has better conductivity.

For example, the metal of the first metal pattern 201 includes an aluminum-based metal, that is, an element aluminum or an alloy formed by aluminum and other metals.

For example, the aluminum-based metal includes one or more selected from the group consisting of Al, AlMo, AlTi, AlMoW, AlMoNb and AlMoTi.

For example, in the aluminum-based metal, a mass percentage of aluminum is ranged from 85 wt % to 100 wt %. For example, the mass percentage of aluminum is 86 wt %, 88 wt %, 90 wt %, 92 wt %, 94 wt %, 96 wt %, 98 wt % or 100 wt %.

Figure 6:
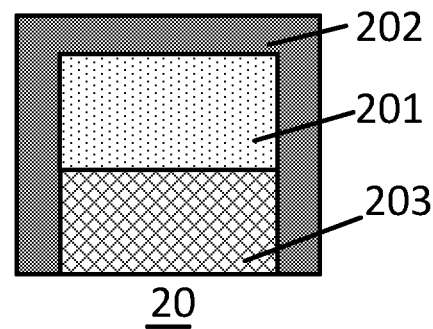
FIG. 6 is another schematic cross-sectional structural view of the conductive pattern in the display substrate according to the embodiments of the present disclosure.

For example, FIG. 6 is another schematic cross-sectional structural view of the conductive pattern in the display substrate according to the embodiments of the present disclosure. As shown in FIG. 6, the conductive pattern 20 further includes a third metal pattern 203 arranged on a side of the first metal pattern 201 close to the base substrate (the base substrate is not shown in FIG. 6), and the second metal pattern 202 covers at least a portion of at least one side surface of the third metal pattern 203 and at least a portion of at least one side surface of the first metal pattern 201. In FIG. 6, for example, the second metal pattern 202 covers an entirety of each of the side surfaces of the third metal pattern 203 and an entirety of the upper surface of the first metal pattern 201 and an entirety of each of the side surfaces of the first metal pattern 201.

For example, the metal of the third metal pattern 203 is the same as the metal of the second metal pattern 202, and the metal of the third metal pattern includes one or more selected from the group consisting of nickel, cobalt, molybdenum, tungsten, copper, niobium, and titanium; that is, the metal of the third metal pattern 203 for example is a single metal of nickel, cobalt, molybdenum, tungsten, copper, niobium, and titanium, or is an alloy formed by two or more selected from the group consisting of the above metals, for example, NiCo, NiMo, NiTi, NiCu, CuNb, NiW, etc.

For example, in the case where the conductive pattern is used as a source electrode and a drain electrode of a thin film transistor and the material of the active layer is polysilicon, if the first metal pattern directly contacts the active layer manufactured by polysilicon, the problem that the resistance of the contact surface therebetween is excessive may occur. However, if the metal of the third metal pattern is in direct contact with the active layer manufactured by polysilicon, a new chemical bond will be formed at an interface therebetween to reduce the resistance, for example, a Ti—Si bond is formed, which acts as a bridge to reduce the resistance at the contact surface between the conductive pattern and the active layer manufactured by the polysilicon.

Figure 7:
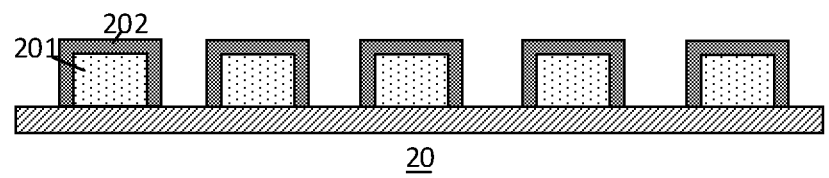
FIG. 7 is still another schematic cross-sectional structural view of the conductive pattern in the display substrate according to the embodiments of the present disclosure.

For example, FIG. 7 is still another schematic cross-sectional structural view of the conductive pattern in the display substrate according to the embodiments of the present disclosure. As shown in FIG. 7, the conductive pattern 20 includes a plurality of first metal patterns 201 and a plurality of second metal patterns 202, the plurality of first metal patterns 201 are spaced apart from each other and the plurality of second metal patterns 202 are spaced apart from each other. Each of the plurality of the first metal patterns 201 and its corresponding second metal pattern 202 are combined to form a sub-conductive pattern, and adjacent sub-conductive patterns are spaced apart from each other to be electrically insulated from each other. For example, the entire conductive pattern 20 is used as the conductive pattern in the bonding region of the display substrate, output lines of an integrated circuit, or gate lines or data lines in the bonding region of a display panel, etc.

Figure 8:
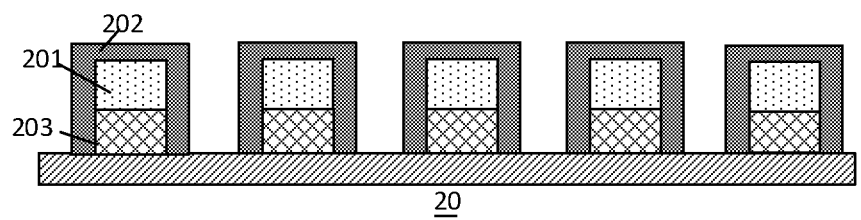
FIG. 8 is still another schematic cross-sectional structural view of the conductive pattern in the display substrate according to the embodiments of the present disclosure.

For example, FIG. 8 is still another schematic cross-sectional structural view of the conductive pattern in the display substrate according to the embodiments of the present disclosure. As shown in FIG. 8, the conductive pattern 20 includes a plurality of first metal patterns 201, a plurality of second metal patterns 202, and a plurality of third metal patterns 203, the plurality of first metal patterns 201 are spaced apart from each other, the plurality of second metal patterns 202 are spaced apart from each other, and the plurality of third metal patterns 203 are spaced apart from each other. Each first metal pattern 201, its corresponding second metal pattern 202, and its corresponding third metal pattern 203 are combined to form a sub-conductive pattern, and adjacent sub-conductive patterns are spaced apart from each other to be electrically insulated from each other. The entire conductive pattern 20 for example is used as the output lines of the integrated circuit in the bonding region of the base substrate.

At least one embodiment of the present disclosure further provides a display panel. The display panel includes the display substrate in any one of the above embodiments. The display panel for example is a liquid crystal display panel or an organic light-emitting diode (OLED) display panel.

For example, the conductive pattern in the display substrate is a metal wire in the bonding region of the peripheral region of the display panel.

Figure 9:
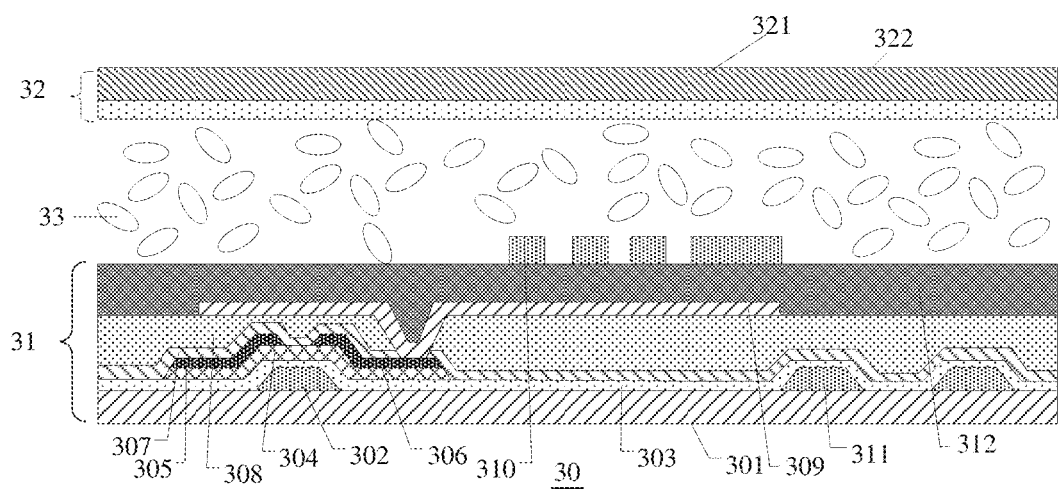
FIG. 9 is a schematic cross-sectional structural view of a display panel according to the embodiments of the present disclosure.

For example, FIG. 9 is a schematic cross-sectional structural view of the display panel according to the embodiments of the present disclosure. FIG. 9 illustrates an example in which the display panel is the liquid crystal display panel. As shown in FIG. 9, the display panel 30 includes an array substrate 31 and a counter substrate 32 which are oppositely arranged, and a liquid crystal layer 33 which is arranged between the array substrate 31 and the counter substrate 32. The array substrate 31 is the display substrate in any one of the above embodiments.

For example, the counter substrate 32 and the array substrate 31 are the upper substrate of the display panel 30 and the lower substrate of the display panel 30, respectively. A display structure such as a thin film transistor array and the like is formed on the array substrate 31, and a color filter is formed on the counter substrate 32. For example, the counter substrate 32 is a color filter substrate. The counter substrate 32 for example includes color filter units corresponding to sub-pixels on the array substrate 31, and further includes a black matrix, etc.

As shown in FIG. 9, The array substrate 31 includes a first substrate 301 on which a gate electrode 302, a gate insulation layer 303, an active layer 304, a first source-drain electrode 305, a second source-drain electrode 306, an organic insulation layer 307, a passivation layer 308, a first electrode 309, a first insulation layer 312, a second electrode 310, and a common electrode line 311 are arranged. For example, a gate line (not shown in the figure) connected with the gate electrode 302, a data line (not shown in the figure) electrically connected with the first source-drain electrode 305 or the second source-drain electrode 306, the gate insulation layer 303, the organic insulation layer 307, the passivation layer 308, the first insulation layer 312, and the like extend from the display region to the peripheral region, particularly to the bonding region of the peripheral region.

For example, the gate line (not shown in the figure) and the data line (not shown in the figure) which extend to the bonding region of the display panel 30, are the conductive pattern in any one of the display substrates in the embodiments of the present disclosure, so that by forming the second metal pattern of which the metal has a relatively weak activity (for example, a pattern of a single metal of nickel, molybdenum, niobium, tungsten, copper, and titanium, or a pattern formed by an alloy of the above metals) on at least a portion of at least one side surface of the first metal pattern (for example, a metal pattern of aluminum), the first metal pattern formed by aluminum can be effectively prevented from reacting with the etching solution used in the subsequent processes of forming other layers or electrodes, so that the influence of the etching solution on the conductive performance of metal wires (for example, gate lines, data lines) or metal electrodes is reduced.

For example, even if the metal of the second metal pattern reacts with the etching solution, a thin and dense film is soon formed on the surface of the second metal pattern, thus preventing the reaction from performing further.

For example, the active layer 304 is a metal oxide semiconductor, and the material of the active layer 304 includes IGZO, HIZO, IZO, a-InZnO, a-InZnO, ZnO, $In_2O_3$:Sn, $In_2O_3$:Mo, $Cd_2SnO_4$, ZnO:Al, $TiO_2$:Nb, or CD-Sn—O.

For example, the material of the gate insulation layer 303 includes one or more selected from the group consisting of silicon oxide, silicon nitride and silicon oxynitride. Further, the material of the gate insulation layer 303 may adopt other inorganic insulation materials having the same or similar material characteristics as those of the above substances.

For example, the first substrate 301 includes a transparent insulation substrate, and the material of the first substrate 301 is glass, quartz, plastic, or other suitable materials.

For example, the material of the organic insulation layer 307 includes one or more selected from the group consisting of polyimide, tetrafluoroethylene-perfluoroalkoxy vinyl ether copolymer, acrylic resin, and polyethylene terephthalate.

For example, the material of the passivation layer 308 includes one or more selected from the group consisting of silicon nitride, silicon oxide, silicon oxynitride, titanium dioxide, and aluminum oxide.

For example, the first electrode 309 is a pixel electrode and the second electrode 310 is a common electrode. Alternatively, the first electrode 309 is a common electrode and the second electrode 310 is a pixel electrode. The forming sequence of the first electrode 309 and the second electrode 310 may be reversed, that is, the second electrode 310 is located above the first electrode 309, or the first electrode 309 is located above the second electrode 310, which is not limited here.

For example, the first electrode 309 and the second electrode 310 are formed by a transparent conductive material or a metal material. For example, the transparent conductive material includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc. The metal material includes silver or aluminum, etc.

As shown in FIG. 9, the counter substrate 32 includes a second substrate 321 on which a color filter layer 322 is arranged.

For example, an upper polarization plate is arranged on a side of the counter substrate 32 facing away from the array substrate 31, and a lower polarization plate is provided on a side of the array substrate 31 facing away from the counter substrate 32.

For example, in the above liquid crystal display panel provided by the embodiments of the present disclosure, a backlight module arranged at an outer side of the array substrate is included. For example, the backlight module includes an LED lamp assembly, a reflection plate, and a light guide plate. Of course, the backlight module may include other components, which are not limited here.

Figure 10:
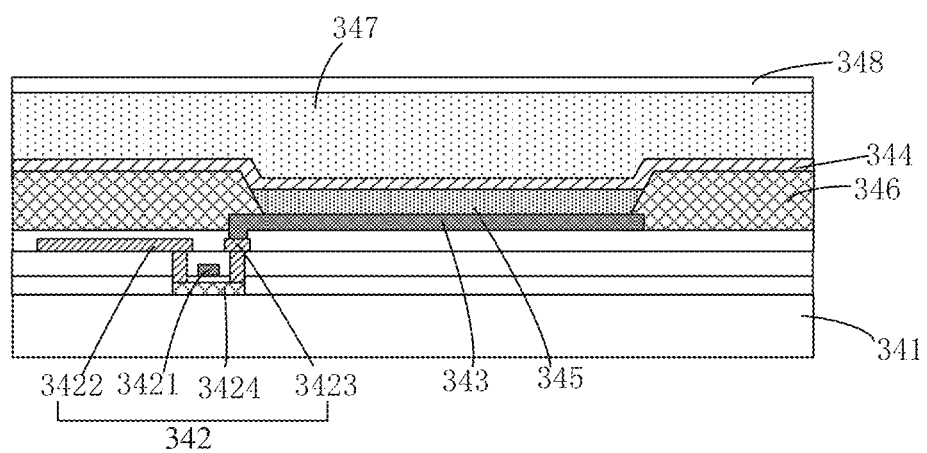
FIG. 10 is another schematic cross-sectional structural view of the display panel according to the embodiments of the present disclosure.

For example, FIG. 10 is another schematic cross-sectional structural view of the display panel according to the embodiments of the present disclosure. FIG. 10 illustrates an example in which the display panel is the organic light-emitting diode (OLED) display panel. As shown in FIG. 10, the organic light-emitting diode (OLED) display panel includes a base substrate 341 and a drive transistor 342, a cathode 343, an anode 344, and an organic functional layer 345 arranged between the cathode 343 and the anode 344, which are arranged on the base substrate 341. The drive transistor 342 includes a gate electrode 3421, a source electrode 3422, a drain electrode 3423, and an active layer 3424. The cathode 343 is electrically connected with the source electrode 3422 or the drain electrode 3423. In FIG. 10, the cathode 343 is electrically connected with the drain electrode 3423.

For example, the organic functional layer 345 includes a hole transport layer, a light-emitting layer, and an electron transport layer. In order to improve the efficiency of injecting electrons and holes into the light-emitting layer, the organic functional layer for example further includes other organic functional layers, such as an electron injection layer arranged between the cathode 343 and the electron transport layer, and a hole injection layer arranged between the anode 344 and the hole transport layer.

As shown in FIG. 10, the organic light-emitting diode (OLED) display panel further includes a pixel defining layer 346 formed between the cathode 343 and the anode 344, and the pixel defining layer 346 is configured to isolate two adjacent sub-pixel units.

For example, as water, oxygen and the like have a great influence on the performance of the cathode and the organic functional layer of organic materials, as shown in FIG. 10, the anode 344 of the organic light-emitting diode (OLED) display panel is covered by a passivation layer 347 and an encapsulation layer 348.

For example, the passivation layer 347 is manufactured by silicon nitride (SiNx), silicon oxide (SiOx), acrylic resin, etc.

For example, the material of the encapsulation layer 348 includes a single layer or a composite layer formed of silicon nitride, silicon oxide or photosensitive resin. For example, the photosensitive resin is polyacrylic resin, polyimide resin, polyamide resin, etc.

Figure 11:
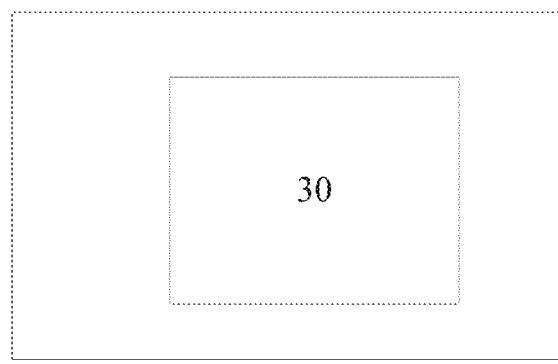
FIG. 11 is a block diagram of a display device according to the embodiments of the present disclosure.

At least one embodiment of the present disclosure further provides a display device, and the display device includes any one of the display panels described above. For example, FIG. 11 is a block diagram of the display device according to the embodiments of the present disclosure. As shown in FIG. 11, the display device 40 includes the display panel 30.

An example of the display device 40 is a liquid crystal display device, in which the array substrate and the counter substrate face each other to form a liquid crystal cell, the array substrate is the display substrate in any one of the above embodiments, and the liquid crystal cell is filled with a liquid crystal material. The counter substrate is, for example, the color filter substrate. The pixel electrode of each sub-pixel of the array substrate is configured to apply an electric field to control the degree of deflection of the liquid crystal material to perform a display operation. In some examples, the liquid crystal display device further includes the backlight module that provides backlight for the array substrate.

In other examples of the display device, the display device for example is an organic light-emitting diode (OLED) display device, an electronic paper display device, etc.

For example, other structures in the display device 40 may be referred to conventional designs. The display device is, for example, any product or component with a display function such as a mobile phone, a tablet computer, a television, a display, a notebook computer, a digital photo frame, a navigator, etc. Other essential components of the display device should be understood by those of ordinary skill in the art, and will not be described in detail herein, which should not be taken as limitations to the present disclosure. The implementation of the display device may refer to the above-mentioned embodiments of the display panel, and the details will not be repeated.

Figure 12:
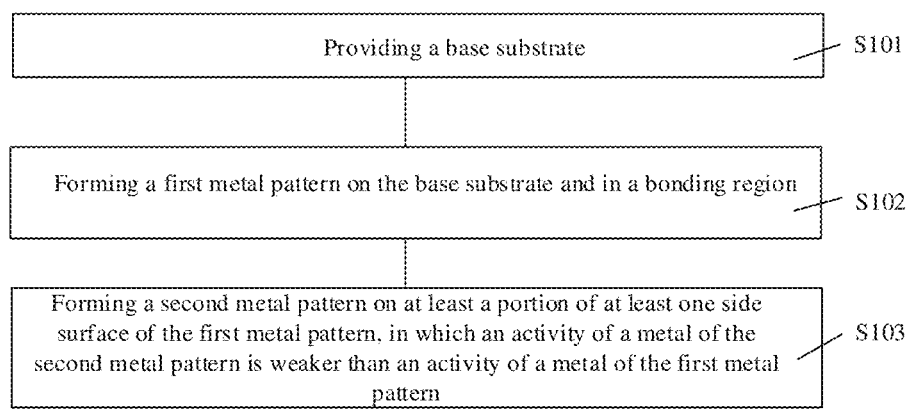
FIG. 12 is a flowchart of a manufacturing method of a display substrate according to the embodiments of the present disclosure.

The embodiments of the present disclosure further provide a manufacturing method of the display substrate. For example, FIG. 12 is a flowchart of a manufacturing method of the display substrate according to the embodiments of the present disclosure. For example, the display substrate includes the display region and the peripheral region at the outer side the display region, and the peripheral region includes the bonding region. The manufacturing method includes the following steps:

S101: providing the base substrate.

S102: forming the first metal pattern on the base substrate and in the bonding region.

For example, the process of forming the first metal pattern includes depositing a first metal film on the base substrate and performing a patterning process on the first metal film to form the first metal pattern.

For example, the first metal film with a thickness of 200-400 nm is continuously deposited by a sputtering method or a thermal evaporation method. For example, the thickness of the first metal film is 200 nm, 250 nm, 300 nm, 350 nm, or 400 nm.

For example, the base substrate is a transparent insulation substrate, and the material of the base substrate is glass, quartz, plastic, or other suitable materials.

For example, the material of the first metal pattern is a low-resistance metal material, and the low-resistance metal material includes an aluminum-based metal, and the aluminum-based metal only includes elemental aluminum, or includes aluminum and other metals simultaneously.

For example, the aluminum-based metal comprises one or more selected from the group consisting of Al, AlMo, AlTi, AlMoW, AlMoNb and AlMoTi.

For example, in the aluminum-based metal, a mass percentage of aluminum is ranged from 85 wt % to 100 wt %. For example, the mass percentage of aluminum is 86 wt %, 88 wt %, 90 wt %, 92 wt %, 94 wt %, 96 wt %, 98 wt % or 100 wt %.

For example, the process of performing the patterning process on the first metal film includes the following steps: coating a layer of photoresist on the first metal film, performing an exposing process and a developing process on the photoresist layer by shielding the photoresist layer with a mask plate, so that a photoresist unreserved region and a photoresist reserved region are obtained, the photoresist reserved region corresponds to the region where the first metal pattern is located, and the photoresist unreserved region corresponds to the region other than the first metal pattern; performing an etching process to completely etch off the portion of the first metal film in the photoresist unreserved region; stripping the remaining portion of the photoresist layer in the photoresist reserved region to form the first metal pattern.

For example, the region where the first metal pattern is located is the region where the gate line in the display substrate or the data line in the display substrate is located.

S103: forming the second metal pattern on at least a portion of at least one side surface of the first metal pattern, in which the activity of the metal of the second metal pattern is weaker than the activity of the metal of the first metal pattern.

The activity of the metal refers to the flexibility that the metal is replaced; the more the activity of the metal is, the less the flexibility that the metal is replaced. According to the order that the metals are arranged in the metal activity sequence table, the activities of the metals gradually decreases from front to back in the metal activity sequence table. In the metal activity sequence table, the position of the metal for forming the first metal pattern is ahead of the position of the metal for forming the second metal pattern.

For example, forming the second metal pattern on at least a portion of at least one side surface of the first metal pattern, includes: forming a second metal film on the first metal pattern, and performing a patterning process on the second metal film to form the second metal pattern covering the at least a portion of at least one side surface of the first metal pattern.

For example, forming the second metal film on the first metal pattern includes depositing the second metal film. For example, the process of depositing the second metal film includes continuously depositing a film of a single metal of nickel, cobalt, molybdenum, tungsten, copper, niobium or titanium metal, or a film formed by an alloy of nickel, cobalt, molybdenum, tungsten, copper, niobium or titanium by using a plasma enhanced chemical vapor deposition (PECVD) method. Then, an etching process is performed on the second metal film to form the second metal pattern. The reactive gases used in the plasma enhanced chemical vapor deposition process are $SiH_4$, $NH_3$, $N_2$, $SH_2Cl_2$ or $N_2$. Using the PECVD deposition method has the advantages of low temperature, fast deposition rate, good film quality, fewer pinholes and the deposited film being not easy to crack.

For example, the thickness of the deposited second metal film is 350 to 600 nm. For example, the thickness of the second metal film is 350 nm, 400 nm, 450 nm, 500 nm, 550 nm, or 600 nm.

For example, the patterning process performed on the second metal film includes a dry etching process.

For example, the dry etchant used for the dry etching includes 1, 3, 3-tetrafluoropropene, which is added with gas and inactive gas.

For example, the added gas includes an oxidizing gas or a reducing gas. The oxidizing gas or reducing gas is one or more selected from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $CH_4$, $C_2H_2$, $C_2H_4$, $C_2H_6$, $C_3H_4$, $C_3H_6$, $C_3H_8$, HF, HI, HBr, HCl, NO, and $NH_3$.

For example, the inactive gas is one or more selected from the group consisting of $N_2$, He, Ar, Ne, and Kr.

For example, in the conductive pattern, the second metal pattern covers the entirety of the upper surface of the first metal pattern and the entirety of each of the side surfaces of the first metal pattern, so that the second metal pattern completely isolates the upper surface of the first metal pattern and the side surfaces of the first metal pattern 201 from the outside, thereby preventing the first metal pattern from being etched by the etching solution used in the subsequent processes of forming other layers or electrodes. Thus, the conductive performance of the metal wires and the metal electrodes formed by the conductive pattern is not adversely affected, and the performance of the display device is ensured.

For example, the conductivity of the metal of the first metal pattern is greater than the conductivity of the metal of the second metal pattern.

For example, in the manufacturing method provided by the embodiments of the present disclosure, forming a third metal film is also included before forming the first metal film. For example, the third metal film is formed by a magnetron sputtering method or a chemical vapor deposition method, then the first metal film is deposited on the third metal film, and the first metal pattern and the third metal pattern are formed in the same patterning process.

For example, the third metal pattern is formed at a side of the first metal pattern close to the base substrate.

For example, the process of depositing the third metal film includes continuously depositing a film of a single metal of nickel, cobalt, molybdenum, tungsten, copper, niobium or titanium metal, or a film formed by an alloy of nickel, cobalt, molybdenum, tungsten, copper, niobium or titanium metal by used a plasma enhanced chemical vapor deposition (PECVD) method. Then, an etching process is performed on the third metal film to form the third metal pattern. The reactive gases used in the plasma enhanced chemical vapor deposition process are $SiH_4$, $NH_3$, $N_2$, $SH_2Cl_2$ or $N_2$. Using the PECVD deposition method has the advantages of low temperature, fast deposition rate, good film quality, fewer pinholes and the deposited film being not easy to crack.

For example, the second metal film is formed on the first metal pattern and the third metal pattern, and a patterning process is performed on the second metal film to form the second metal pattern, in which the second metal pattern covers the upper surface of the first metal pattern and the side surfaces of the first metal pattern, and the second metal pattern further covers at least a portion of at least one side surface of the third metal pattern at the same time. For example, the second metal pattern covers the upper surface of the first metal pattern and the side surfaces of the first metal pattern and covers the entirety of each of the side surfaces of the third metal pattern at the same time. The forming process of the second metal pattern may be referred to the above-mentioned related description, and will not be repeated here.

The display substrate, the display panel, the display device and the manufacturing method of the display substrate provided by the embodiments of the present disclosure have at least one of the following beneficial effects:

(1) According to the display substrate provided by at least one embodiment of the present disclosure, the second metal pattern coating on at least a portion of at least one side surface of the first metal pattern is formed on the first metal pattern to reduce the reaction between the side surface of the first metal pattern and the etching solution used in the subsequent processes of forming film layers or forming electrodes, thereby reducing the problem that the conductivity of the first metal pattern decreases and further reducing the problem of product yield reduction.

(2) According to the manufacturing method of the display substrate provided by at least one embodiment of the present disclosure, requirements on equipment for manufacturing are reduced, and process steps are reduced, so that the complexity of the manufacturing process of the conductive pattern in the display substrate is reduced.

(3) The manufacturing method of the display substrate provided by at least one embodiment of the present disclosure reduces the production cost.

The following statements should be noted:

(1) The accompanying drawings involve only the structure(s) in connection with the embodiment(s) of the present disclosure, and other structure(s) may be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to actual scale. It should be understood that, in the case in which a component or element such as a layer, film, region, substrate or the like is referred to be "on" or "under" another component or element, it may be directly on or under the another component or another element, or a component or an element is interposed therebetween.

(3) In case of no conflict, the embodiments of the present disclosure and the features in the embodiments can be combined with each other to obtain new embodiments.

The above are merely specific implementations of the present disclosure without limiting the protection scope of the present disclosure thereto. The protection scope of the present disclosure should be based on the protection scope of the appended claims.

What is claimed is:

1. A display substrate, comprising: a display region and a peripheral region located at an outer side of the display region, and the peripheral region comprising a bonding region, wherein
the display substrate comprises:
a base substrate,
a first metal pattern and a second metal pattern, which are provided on the base substrate and located in the bonding region, the second metal pattern covers at least a portion of at least one side surface of the first metal pattern, and an activity of a metal of the second metal pattern is weaker than an activity of a metal of the first metal pattern,
the metal of the first metal pattern comprises an aluminum-based metal, and
the metal of the second metal pattern comprises niobium.

2. The display substrate according to claim 1, wherein a conductivity of the metal of the first metal pattern is greater than a conductivity of the metal of the second metal pattern.

3. The display substrate according to claim 1, wherein the second metal pattern further covers a surface of the first metal pattern facing away from the base substrate.

4. The display substrate according to claim 1, further comprising: a third metal pattern,
wherein the third metal pattern is provided at a side of the first metal pattern close to the base substrate.

5. The display substrate according to claim 4, wherein the second metal pattern covers at least a portion of at least one side surface of the third metal pattern.

6. The display substrate according to claim 4, wherein a metal of the third metal pattern is the same as the metal of the second metal pattern.

7. The display substrate according to claim 1, wherein the aluminum-based metal comprises one or more selected from a group consisting of Al, AlMo, AlTi, AlMoW, AlMoNb and AlMoTi.

8. The display substrate according to claim 1, wherein in the aluminum-based metal, a mass percentage of aluminum is ranged from 85 wt % to 100 wt %.

9. The display substrate according to claim 1, further comprising:
a plurality of first metal patterns and a plurality of second metal patterns,
wherein the plurality of first metal patterns are spaced apart from each other, and the plurality of second metal patterns are spaced apart from each other.

10. A display panel, comprising: the display substrate according to claim 1.

11. A display device, comprising: the display panel according to claim 10.

12. A manufacturing method of a display substrate, wherein
the display substrate comprises: a display region and a peripheral region located at an outer side of the display region, and the peripheral region comprises a bonding region; and
the manufacturing method comprises:
providing a base substrate,
forming a first metal pattern on the base substrate and in the bonding region, and
forming a second metal pattern on at least a portion of at least one side surface of the first metal pattern,
wherein an activity of a metal of the second metal pattern is weaker than an activity of a metal of the first metal pattern,
the metal of the first metal pattern comprises an aluminum-based metal, and
the metal of the second metal pattern comprises niobium.

13. The manufacturing method according to claim 12, wherein a conductivity of the metal of the first metal pattern is greater than a conductivity of the metal of the second metal pattern.

14. The manufacturing method according to claim 12, wherein the second metal pattern further covers a surface of the first metal pattern facing away from the base substrate.

15. The manufacturing method according to claim 12, wherein forming the second metal pattern on at least a portion of at least one side surface of the first metal pattern, comprises: forming a second metal film on the first metal pattern, and performing a patterning process on the second metal film to form the second metal pattern covering at least a portion of at least one side surface of the first metal pattern.

16. The manufacturing method according to claim 15, wherein the patterning process performed on the second metal film comprises a dry etching process.

17. The manufacturing method according to claim 12, further comprising: forming a third metal pattern,
wherein the third metal pattern is formed at a side of the first metal pattern close to the base substrate.

18. The manufacturing method according to claim 17, comprising forming the first metal pattern and the third metal pattern in a same patterning process,
wherein the forming the first metal pattern and the third metal pattern in the same patterning process, comprises: sequentially forming a third metal film and a first metal film on the base substrate, and simultaneously performing a dry etching process on the third metal film and the first metal film to form the first metal pattern and the third metal pattern.

* * * * *